United States Patent
Gao et al.

(10) Patent No.: US 9,882,161 B2
(45) Date of Patent: Jan. 30, 2018

(54) PIXEL UNIT AND METHOD FOR MANUFACTURING THE SAME, DISPLAY PANEL, AND DISPLAY APPARATUS

(71) Applicant: BOE TECHNOLOGY GROUP CO., LTD., Beijing (CN)

(72) Inventors: Jing Gao, Beijing (CN); Xiaobo Du, Beijing (CN); Tao Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 14/771,449

(22) PCT Filed: Oct. 28, 2014

(86) PCT No.: PCT/CN2014/089690
§ 371 (c)(1),
(2) Date: Aug. 28, 2015

(87) PCT Pub. No.: WO2016/019638
PCT Pub. Date: Feb. 11, 2016

(65) Prior Publication Data
US 2016/0365534 A1 Dec. 15, 2016

(30) Foreign Application Priority Data
Aug. 7, 2014 (CN) .......................... 2014 1 0386948

(51) Int. Cl.
*H01L 21/00* (2006.01)
*H01L 51/52* (2006.01)
(Continued)

(52) U.S. Cl.
CPC ...... *H01L 51/5225* (2013.01); *H01L 27/3246* (2013.01); *H01L 51/0021* (2013.01);
(Continued)

(58) Field of Classification Search
CPC .................................................. H01L 51/5225
(Continued)

(56) References Cited

U.S. PATENT DOCUMENTS

2005/0263775 A1* 12/2005 Ikeda ................... G09G 3/3291
257/79
2006/0033099 A1 2/2006 Chung et al.
(Continued)

FOREIGN PATENT DOCUMENTS

CN 1886013 A 12/2006
CN 102244202 A 11/2011
(Continued)

OTHER PUBLICATIONS

First Chinese Office Action (including English translation) dated Mar. 17, 2016, for corresponding Chinese Application No. 201410386948.5.
(Continued)

Primary Examiner — Ajay K Arora
(74) Attorney, Agent, or Firm — Kinney & Lange, P.A.

(57) ABSTRACT

The present invention discloses a pixel unit and a method for manufacturing the same, a display panel, and a display apparatus. A pixel unit comprises a first electrode, a pixel defining layer, a light emitting layer and a second electrode, wherein the second electrode comprises a first portion and a second portion; the pixel defining layer defines a pixel region, the light emitting layer and the first portion of the second electrode are disposed successively within the pixel region, and an upper surface of the first portion of the second electrode is substantially in same plane with an upper surface of the pixel defining layer; and, the second portion of the second electrode is positioned over the first portion and is connected with a second electrode of an adjacent pixel unit. With the technical solutions of the present invention, (Continued)

phenomenon including fractures, abscissions, bubbles and the like due to existence of difference in height in the pixel region will be eliminated, averting adverse influence resulting in failures of the display apparatus.

19 Claims, 3 Drawing Sheets

(51) Int. Cl.
  H01L 51/56 (2006.01)
  H01L 27/32 (2006.01)
  H01L 51/00 (2006.01)
  H01L 51/50 (2006.01)
(52) U.S. Cl.
  CPC ...... *H01L 51/5012* (2013.01); *H01L 51/5206* (2013.01); *H01L 51/56* (2013.01); *H01L 2227/323* (2013.01)
(58) Field of Classification Search
  USPC .............................................. 257/40; 438/82
  See application file for complete search history.

(56) References Cited

U.S. PATENT DOCUMENTS

| | | | |
|---|---|---|---|
| 2007/0102714 A1* | 5/2007 | Lee | H01L 27/3211 257/88 |
| 2008/0116792 A1 | 5/2008 | Chung et al. | |
| 2011/0309385 A1* | 12/2011 | Nendai | H01L 51/5209 257/88 |
| 2013/0071775 A1* | 3/2013 | Prushinskiy | G03F 1/20 430/5 |

FOREIGN PATENT DOCUMENTS

| | | |
|---|---|---|
| CN | 102334385 A | 1/2012 |
| CN | 103700685 A | 4/2014 |
| CN | 103824873 A | 5/2014 |

OTHER PUBLICATIONS

International Search Report and Written Opinion from PCT Application Serial No. PCT/CN2014/089690, dated May 20, 2015, 10 pages.

\* cited by examiner

PIXEL UNIT AND METHOD FOR MANUFACTURING THE SAME, DISPLAY PANEL, AND DISPLAY APPARATUS

BACKGROUND

Technical Field

Embodiments of the present invention relate to the field of display technologies, and particularly, to a pixel unit and a method for manufacturing the same, a display panel, and a display apparatus.

Description of the Related Art

Organic Light-Emitting Diode (OLED) device, due to its advantages including fully solid state construction, high brightness, full viewing angle, fast response time, broad working temperature range, flexible displaying and the like, becomes currently a younger generation display technology which is highly competitive and has a development prospect.

FIG. 1 shows a conventional process of manufacturing an OLED display apparatus. Firstly, array 102 of thin-film transistors (TFT) is manufactured on a flexible substrate 101, in which ITO pixel electrodes are separated by a pixel defining layer (PDL) 103 to define a pixel region; then, material 104 for light emitting layer and material 105 for negative electrode are deposited within the pixel region; and finally, subsequent processes are performed, to finish manufacture of the OLED display apparatus. Generally, material for light emitting layer comprises a Hole Injection Layer (HIL), a Hole Transport Layer (HTL), an Organic Layer, an Electron Transport Layer (ETL), and an Electron Injection Layer (EIL). In conventional process, the Hole Injection Layer (HIL), the Hole Transport Layer (HTL), the Electron Transport Layer (ETL), and the Electron Injection Layer (EIL), etc. are deposited mainly by means of using an open-type mask, material for the Organic Layer R, G, B is deposited by means of using a fine metal mask (FMM), and, material for negative electrode is usually deposited by means of using an open-type mask. In the subsequent processes, flexible packaging, i.e., thin film encapsulation (TEF), Dam &Fill, or adhesive+barrier film, is performed.

Material for the pixel defining layer is usually made of adhesive and has a thickness at micrometer-scale, while thicknesses of the materials for the light emitting layer and for the negative electrode deposited are of the order of magnitude of hundreds of nanometers. As a result, there is difference in height between material for the pixel defining layer and material for the light emitting layer as well as material for the negative electrode thereover. For a flexible OLED display apparatus, when the OLED display apparatus is bent, such difference in height between the pixel defining layer and the negative electrode likely causes phenomenon including fractures of the negative electrode or abscissions of the negative electrode from the pixel defining layer to occur at a stress concentration zone. Secondly, for flexible packaging, such as barrier film, Dam &Fill, and TFE, bubbles extremely likely occur at a position where there is difference in height between the pixel defining layer and the negative electrode, adversely affecting the package effect. These problems greatly adversely affect display effect of the display apparatus, and even cause failures of the display apparatus.

SUMMARY

According to a first aspect of the present invention, there is provided a pixel unit comprising a first electrode, a pixel defining layer, a light emitting layer and a second electrode, wherein the second electrode comprises a first portion and a second portion; the pixel defining layer defines a pixel region, the light emitting layer and the first portion of the second electrode are disposed successively within the pixel region, and an upper surface of the first portion of the second electrode is substantially in same plane with an upper surface of the pixel defining layer; and, the second portion of the second electrode is positioned over the first portion and is connected with a second electrode of an adjacent pixel unit.

According to a second aspect of the present invention, there is provided a display panel comprising the abovementioned pixel unit.

According to a third aspect of the present invention, there is provided a display apparatus comprising the abovementioned display panel.

According to a fourth aspect of the present invention, there is provided a method for manufacturing a pixel unit, the method comprising:

forming a first electrode;

forming a pixel defining layer, and patterning the pixel defining layer to define a pixel region;

forming a light emitting layer within the pixel region;

forming a first portion of a second electrode on the light emitting layer such that an upper surface of the first portion of the second electrode is substantially in same plane with an upper surface of the pixel defining layer;

forming a second portion of the second electrode on the first portion of the second electrode, wherein the second portion of the second electrode is connected with a second electrode of an adjacent pixel unit.

DETAILED DESCRIPTION OF THE EMBODIMENTS

In order to provide a more clear understanding of objects, technique solutions and advantages of the present invention, embodiments of the present invention will be further described hereinafter in detail in conjunction with these embodiments and with reference to the attached drawings.

For easy explanations, lots of details are presented in the following description in order to provide a complete understanding of these disclosed embodiments. However, obviously, one or more embodiments can be implemented without these details. In other cases, well-known structures and devices are simplified for clear purposes.

In accordance with a general concept of the present invention, there provides a pixel unit comprising a first electrode, a pixel defining layer, a light emitting layer and a second electrode, wherein the second electrode comprises a first portion and a second portion; the pixel defining layer defines a pixel region, the light emitting layer and the first portion of the second electrode are disposed successively within the pixel region, and an upper surface of the first portion of the second electrode is substantially in same plane with an upper surface of the pixel defining layer; and, the second portion of the second electrode is positioned over the first portion and is connected with a second electrode of an adjacent pixel unit. Meanwhile, there also provides a method for manufacturing the abovementioned pixel unit, a display panel comprising the abovementioned pixel unit, and a display apparatus comprising the abovementioned display panel.

Figure 1:
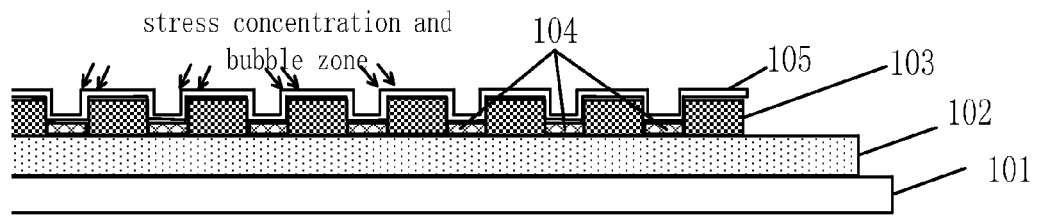
FIG. 1 is a schematic view of a plurality of pixel units in an OLED display apparatus made by conventional process in the prior art.
Figure 2:
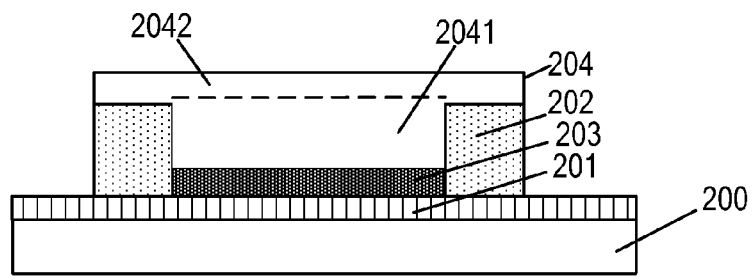
FIG. 2 is a schematic view of a pixel unit according to an embodiment of the present invention.

FIG. 2 is a schematic view of a pixel unit according to an embodiment of the present invention. Referring to FIG. 2, the pixel unit comprises a substrate 200, a first electrode 201, a pixel defining layer 202, a light emitting layer 203 and a second electrode 204, wherein the second electrode 204 comprises a first portion 2041 and a second portion 2042; the pixel defining layer 202 defines a pixel region, the light emitting layer 203 and the first portion 2041 of the second electrode 204 are disposed successively within the pixel region, and an upper surface of the first portion 2041 of the second electrode 204 is substantially in same plane with an upper surface of the pixel defining layer; and, the second portion 2042 of the second electrode 204 is positioned over the first portion 2041 and is connected with a second electrode of another pixel unit.

It can be seen from FIG. 2, the upper surface of the first portion 2041 of the second electrode 204 is substantially in same plane with the upper surface of the pixel defining layer. Accordingly, there is substantially no difference in height existing between the first portion 2041 of the second electrode 204, as common electrode, and the pixel defining layer 202, so that the second portion 2042 of the second electrode 204 is substantially flat. As a result, when the display panel formed by the pixel unit is bent, phenomenon, which adversely affects encapsulation effect, including fractures or bubbles, will not occur. As being known for those skilled in the art, due to technical restrictions, certain amount of difference in height may appear between the first portion 2041 of the second electrode 204 and the pixel defining layer 202, however, if the amount of difference in height is restricted within a certain range, for example, from −200 nm to 200 nm. Since the amount of difference in height is very small, the effect of such difference in height on a flatness of the second portion 2042 of the second electrode 204 is almost negligible. As a result, in a practical manufacturing process, the object of the present invention can be achieved, so long as the amount of difference in height between the first portion 2041 of the second electrode 204 and the pixel defining layer is within a permissible error range, in order words, so long as the upper surface of the first portion 2041 of the second electrode 204 is substantially in same plane with the upper surface of the pixel defining layer.

Optionally, the first electrode 201 is located below both the pixel defining layer 202 and the light emitting layer 203, and is connected with a first electrode 201 of another pixel unit to form common electrode, as shown in FIG. 2. In other embodiments, the first electrode 201 is located only below the light emitting layer 203 and certain gaps are provided among the first electrodes 201 of different pixel units.

Optionally, the first electrode 201 may be positive electrode or negative electrode, and preferably is positive electrode. If the first electrode 201 is positive electrode, material for the first electrode 201 may include high work content transparent conductive material or semitransparent conductive material, for example, ITO, Ag, NiO, Al or graphene. If the first electrode 201 is negative electrode, preferably, material for the first electrode 201 may include low work content metals or combinations thereof, for example, one or any combinations of Al, Mg, Ca, Ba, Na, Li, K and Ag.

Optionally, the first electrode 201 may have a shape of parallelogram or ellipse. Here, parallelogram may include rectangle, square or rhomb. In practical applications, the first electrode 201 may also have any other shape, e.g., quadrilateral of arbitrary structure, in accordance with production requirements.

It should be noted that, position of formation, material and shape, etc. of the first electrode 201 are not limited to those recited in the above embodiments, as long as it can achieve the functions of a positive electrode or a negative electrode of the pixel unit and is applicable in embodiments of the present invention.

Optionally, the pixel defining layer 202 may be made of inorganic material, e.g., $SiO_2$, SiNx and the like. Or else, it may be made of organic material, e.g., photoresist and the like.

Optionally, the pixel defining layer 202 is formed on the first electrode 201 and has an annular structure in which the pixel region is defined, and, both the light emitting layer 203 and the first portion 2041 of the second electrode 204 are formed within the pixel region such that the pixel defining layer 202 is disposed around them. The substrate 200 may be a glass substrate, or an array substrate formed with TFT array circuit.

Optionally, the light emitting layer 203 comprises a hole injection layer, a hole transport layer, an organic layer, a hole stop layer, an electron stop layer, an electron transport layer, and an electron injection layer; or it comprises an organic layer and/or one or any combination of these other layers.

The second electrode 204 is formed on the light emitting layer 203.

Optionally, the second electrode 204 may be positive electrode or negative electrode, and preferably is negative electrode. If the second electrode 204 is negative electrode, material for the second electrode 204 may include low work content metals or combinations thereof, for example, one or any combination of Al, Mg, Ca, Ba, Na, Li, K and Ag. If the second electrode 204 is positive electrode, material for the second electrode 204 may include high work content transparent conductive material or semitransparent conductive material, for example, ITO, Ag, NiO, Al or graphene.

Figure 3:
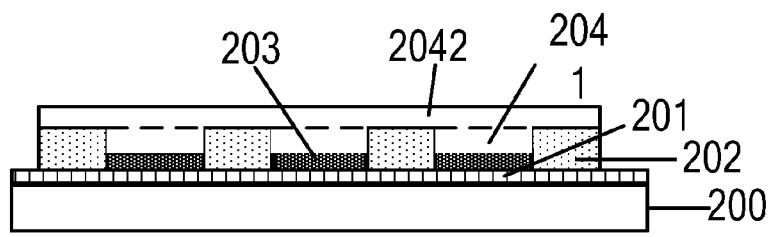
FIG. 3 is a schematic view of a plurality of pixel units, manufactured by an open-type mask, according to an embodiment of the present invention.

Optionally, the first portion 2041 of the second electrode 204 is used to fill and level up difference in height between the pixel defining layer 202 and the light emitting layer 203, such that the upper surface of the first portion 2041 is substantially in same plane with the upper surface of the pixel defining layer 202. In other words, a total thickness of the light emitting layer 203 and the first portion 2041 of the second electrode 204 substantially equals to a thickness of the pixel defining layer 202. Optionally, the second portion 2042 of the second electrode 204 is formed above not only the first portion 2041 of the second electrode 204 but also the pixel defining layer 202. Since the upper surface of the first portion 2041 of the second electrode 204 is substantially in same plane with the upper surface of the pixel defining layer 202, the second portion 2042 of the second electrode 204 may be evenly disposed on the upper surfaces of the first portion 2041 of the second electrode 204 and of the pixel defining layer 202, to form a portion of common electrode connected with another pixel unit, as shown in FIG. 3.

Optionally, the second portion 2042 of the second electrode 204 is formed on the upper surface of part of the pixel defining layer 202 or of the entire pixel defining layer 202. It mainly depends on a process for manufacturing the second portion 2042 of the second electrode 204. If a slit-type fine metal mask (FMM slit Mask) is employed to manufacture the second portion 2042 of the second electrode 204, the second portion 2042 of the second electrode 204 only covers a portion of the pixel defining layer 202, because it is connected with a second electrode of an adjacent pixel unit in a fore-and-aft direction but, together with an adjacent pixel unit in a left and right direction, forms a gap. If an open-type mask process is employed to manufacture the second portion 2042 of the second electrode 204, the second portion 2042 of the second electrode 204 covers whole upper surface of the pixel defining layer, because it is connected with all the second electrodes of adjacent pixel units around the second electrode. FIG. 3 is a schematic view of a plurality of pixel units manufactured by means of an open-type mask process. It can be seen from FIG. 3 that, the second portions 2042 of the second electrodes 204 of the plurality of pixel units are substantially evenly connected with one another, eliminating fracture phenomenon occurring in the conventional process.

In embodiments of the present invention, the first electrode 201 is preferably positive electrode while the second electrode 204 is preferably negative electrode. This is because, when the second electrode 204 is negative electrode, material for the second electrode 204 may include low work content metals or combinations thereof, for example, one or any combinations of Al, Mg, Ca, Ba, Na, Li, K and Ag. The abovementioned materials are suitable for manufacturing by means of a block-type fine metal mask vapor deposition. Accordingly, the block-type fine metal mask vapor deposition may be preferably employed in the manufacture of the first portion 2041 of the second electrode 204.

In embodiments of the present invention, the block-type fine metal mask vapor deposition is suitable for the manufacture of the first portion 2041 of the second electrode 204, this is because the first portion 2041 of the second electrode 204 is required to be formed within a pixel region defined by the pixel defining layer 202, in order to fill and level up difference in height between the pixel defining layer 202 and the light emitting layer 203. Employment of the block-type fine metal mask allows the material for the second electrode 204 to be accurately manufactured, by vapor deposition, within the pixel region, without involving any other process steps and thus reducing process steps.

Optionally, the pixel unit is an OLED unit.

The OLED unit according to embodiments of the present invention is suitable to be used in both a bottom emission type OLED device and a top emission type OLED device, especially, it is suitable to be used in a bottom emission type OLED device. This is because that, the second electrode (negative electrode) of a conventional top emission type device is made of semitransparent metal having a relatively smaller thickness, but in the OLED unit according to embodiments of the present invention, the first portion 2041 and the second portion 2042 of the second electrode 204 have a relatively greater total thickness, which may affect emission of light of the top emission type device, accordingly, it is more suitable to be used in a bottom emission type OLED device.

An embodiment of the present invention further provides a display panel comprising a plurality of abovementioned pixel units. Optically, the display panel may be an OLED display panel.

An embodiment of the present invention further provides a display apparatus comprising abovementioned display panel. Optically, the display apparatus may be an OLED display apparatus.

Figure 4:
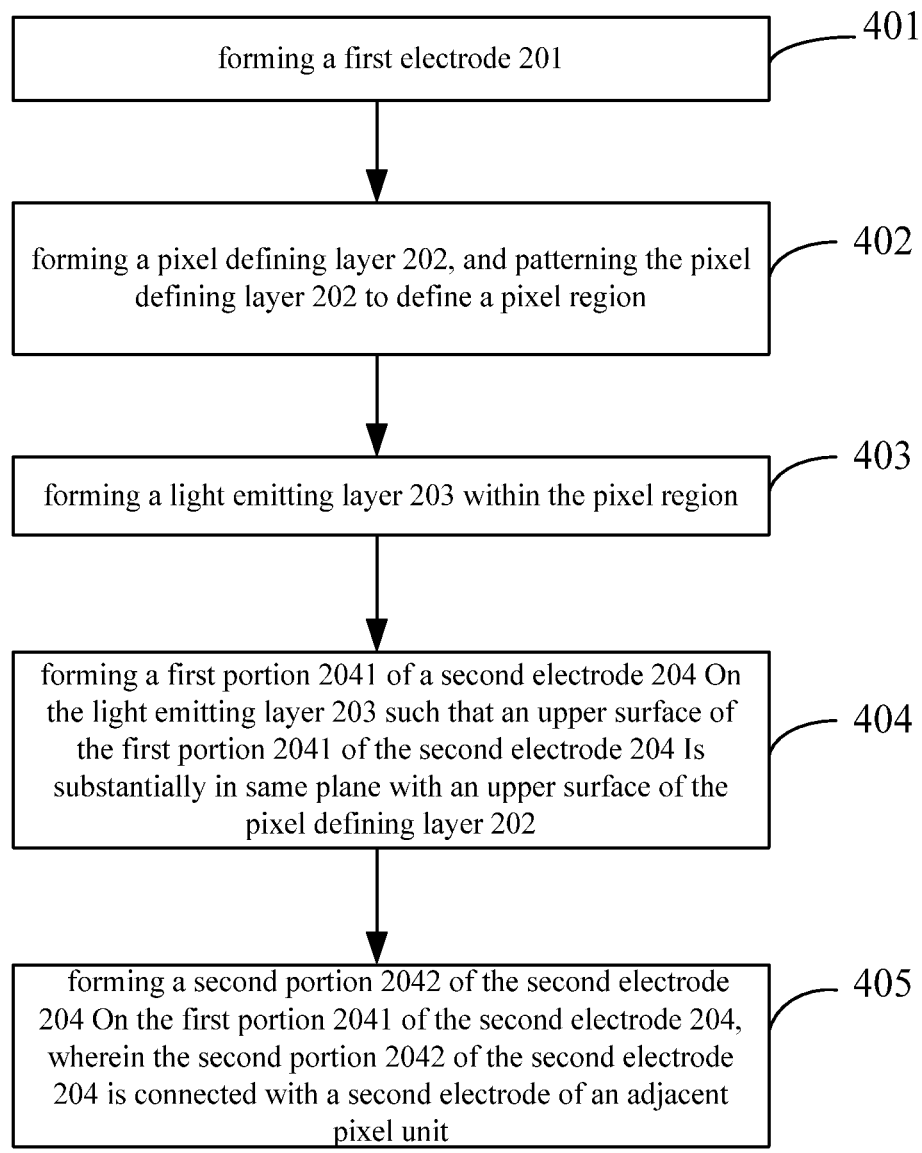
FIG. 4 is a flow diagram of a method for manufacturing a pixel unit according to an embodiment of the present invention.

FIG. 4 is a flow diagram of a method for manufacturing a pixel unit according to an embodiment of the present invention. FIGS. 5(A)-5(E) are flow diagrams of processes of manufacturing a pixel unit according to an embodiment of the present invention. Referring to FIGS. 4 and 5(A)-5(E), as an exemplary example, the method for manufacturing a pixel unit comprising:

a step 401 of forming a first electrode 201;

a step 402 of forming a pixel defining layer 202, and patterning the pixel defining layer 202 to define a pixel region;

a step 403 of forming a light emitting layer 203 within the pixel region;

a step 404 of forming a first portion 2041 of a second electrode 204 on the light emitting layer 203 such that an upper surface of the first portion 2041 of the second electrode 204 is substantially in same plane with an upper surface of the pixel defining layer 202; and a step 405 of forming a second portion 2042 of the second electrode 204 on the first portion 2041 of the second electrode 204, wherein the second portion 2042 of the second electrode 204 is connected with a second electrode of an adjacent pixel unit.

Figure 5:
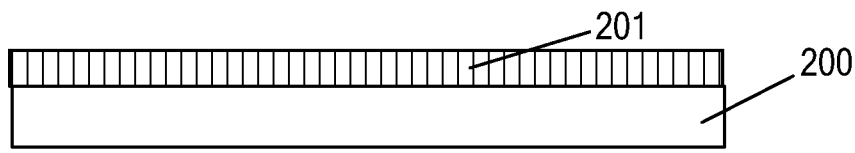
FIGS. 5(A)-5(E) are flow diagrams of processes of manufacturing a pixel unit according to an embodiment of the present invention.
Figure 5:
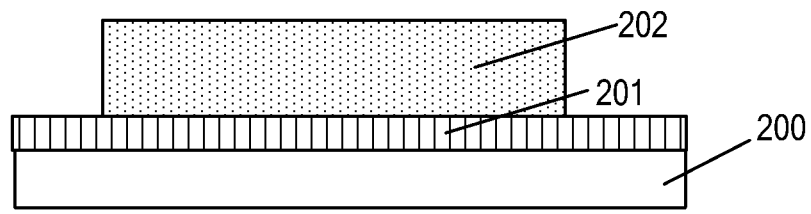
Figure 5:
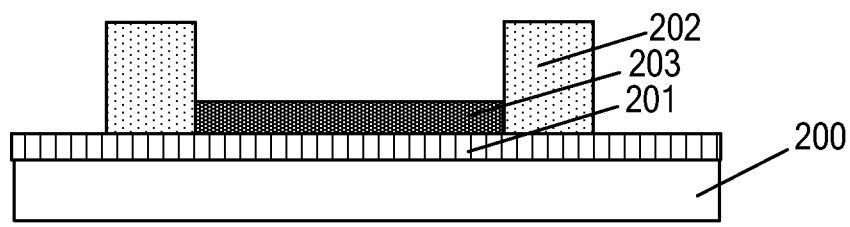
Figure 5:
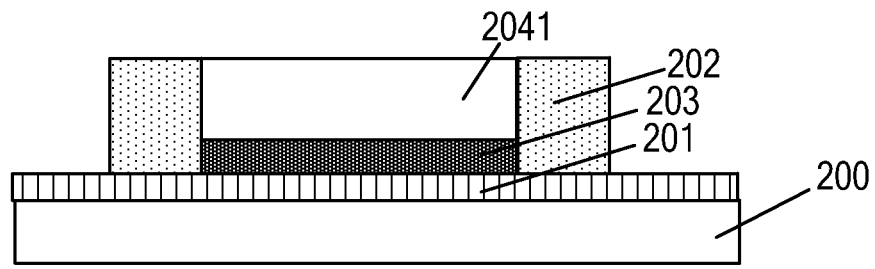
Figure 5:
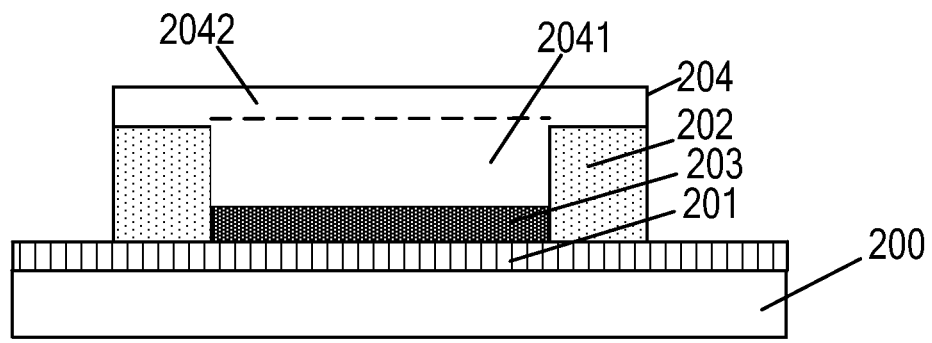

As an exemplary example, in the step 401, optically, the first electrode 201 is formed on a glass substrate 200, or on an array substrate 200 formed with array circuit, as shown in FIG. 5(A). The substrate 200 may be flexible substrates made of PET (polyethylene terephthalate), PI (polyimide), PEN (polyethylene naphthalate) and the like.

Optionally, the first electrode 201 may be positive electrode or negative electrode, and preferably is positive electrode. If the first electrode 201 is positive electrode, material for the first electrode 201 may include high work content transparent conductive material or semitransparent conductive material, for example, ITO, Ag, NiO, Al or graphene. If the first electrode 201 is negative electrode, preferably, material for the first electrode 201 may include low work content metals or combinations thereof, for example, one or any combinations of Al, Mg, Ca, Ba, Na, Li, K and Ag.

In the step 402, "patterning the pixel defining layer 202" means that a portion of material for the pixel defining layer 202, over the first electrode 201 is removed, so that the pixel defining layer 202 has an annular structure. A region surrounded by the annular structure is the pixel region.

Optionally, the pixel defining layer 202 is made of inorganic material, e.g., $SiO_2$, SiNx and the like. As an exemplary example, the step 402 may further comprise the following sub-steps of:

forming, by means of a chemical vapor deposition, an inorganic material layer having a thickness in the range of about 100-400 nm, over the substrate 200 formed with the first electrode 201, as shown in FIG. 5(B), wherein the inorganic material has a greater thickness than the first electrode 201;

spin coating a photoresist on the inorganic material layer, and then performing exposure and development, wherein an area of exposure equals to an area of the pixel region to be formed; and dry etching the inorganic material layer, to remove the exposed and developed inorganic material layer and removing rest of the photoresist, so as to form the pixel defining layer 202, as shown in FIG. 5(C).

Optionally, the pixel defining layer 202 is made of organic material, e.g., photoresist. As an exemplary example, the step 402 may further comprise the following sub-steps of:

coating, by means of slit coating or spin coating, the substrate 200 formed with the first electrode 201, with organic photoresist material, to form an organic film having a thickness in the range of about 100-2000 nm, wherein the organic photoresist material has a greater thickness than a height of the first electrode 201; and exposing and developing the organic photoresist material, wherein an area of exposure equals to an area of the pixel region to be formed, and wherein over exposure is performed on the photoresist formed on the surface of the first electrode 201 during the exposing, to completely remove the photoresist on its upper surface, so as to form the pixel defining layer 202.

As an exemplary example, referring to FIG. 5(C), in the step 403 of forming the light emitting layer 203, the light emitting layer 203 is formed by means of solution process or vapor deposition process.

Optionally, the step of forming the light emitting layer 203 may specifically comprise:

Ink jet printing a hole injection layer (HIL), a hole transport layer (HTL), an organic Layer and the like, respectively, and vapor depositing an electron transport layer (ETL), an electron injection layer (EIL) and the like, within the pixel region, to finish the manufacture of the light emitting layer 203.

Referring to FIG. 5(D), in the step 404, "an upper surface of the first portion 2041 of the second electrode 204 is substantially in same plane with an upper surface of the pixel defining layer 202" means that a difference in height between the first portion 2041 of the second electrode 204 and the pixel defining layer 204 is in a range from −200 nm to 200 nm.

Optionally, the second electrode 204 may be positive electrode or negative electrode, and preferably is negative electrode. This is because, if the second electrode 204 is negative electrode, material for the second electrode 204 may include low work content metals or combinations thereof, for example, one or any combination of Al, Mg, Ca, Ba, Na, Li, K and Ag. The abovementioned materials are suitable for manufacturing by means of a block-type fine metal mask vapor deposition. Accordingly, the block-type fine metal mask vapor deposition may be preferably employed in the manufacture of the first portion 2041 of the second electrode 204. Of course, in the present invention, other process may be employed in the manufacture of the second electrode 204 as a positive electrode.

Optionally, the first portion 2041 of the second electrode 204 has a thickness in the range of 100 nm-1 um.

Optionally, the step 404 may further comprise the following sub-steps of:

depositing, by means of a block-type fine metal mask, material for the second electrode on the light emitting layer 203, to fill and level up difference in height between the pixel defining layer 202 and the light emitting layer 203, so that the surface of the material for the second electrode after the filling and leveling up is substantially in same plane with the upper surface of the pixel defining layer 202, so as to form the first portion 2041 of the second electrode 204.

In embodiments of the present invention, the block-type fine metal mask vapor deposition is suitable for the manufacture of the first portion 2041 of the second electrode 204, this is because the first portion 2041 of the second electrode 204 is required to be formed within a pixel region defined by the pixel defining layer 202, in order to fill and level up difference in height between the pixel defining layer 202 and the light emitting layer 203. Employment of the block-type fine metal mask allows the material for the second electrode to be accurately manufactured, by vapor deposition, within the pixel region, without involving any other process steps and thus reducing process steps.

Optionally, the second electrode 204 may be positive electrode or negative electrode, and preferably is negative electrode. If the second electrode 204 is negative electrode, material for the second electrode 204 may include low work content metals or combinations thereof, for example, one or any combination of Al, Mg, Ca, Ba, Na, Li, K and Ag. If the second electrode 204 is positive electrode, material for the second electrode 204 may include high work content transparent conductive material or semitransparent conductive material, for example, ITO, Ag, NiO, Al or graphene.

Optionally, referring to FIG. 5(E), the step 405 may further comprise the following sub-steps of:

continuing to deposit, by means of open-type mask, the material for the second electrode, to form a second portion 2042 of the second electrode 204; and covering whole surface of the substrate 200 with the material for the second electrode that has been deposited by means of open-type mask. In other words, both the second portion 2042 of the second electrode 204 and a second electrode of another pixel unit are formed in an open region of the open-type mask, so as to form common electrode.

Thus it can be seen, the second portion 2042 of the second electrode 204 manufactured in this way covers over whole upper surface of the first portion 2041 of the second electrode 204 as well as of the pixel defining layer 202.

Optionally, the step 405 may also comprise the following sub-steps of (not shown):

continuing to deposit, by means of slit-type fine metal mask, the material for the second electrode, to form a second portion of the second electrode; and forming an elongated electrode on whole surface of the substrate 200 with the material for the second electrode that has been deposited by means of slit-type fine metal mask. In other words, the second portions of the second electrodes in each row of pixel unit form common electrode while leaving certain gaps among the second portions of the second electrodes in different rows of pixel units.

Thus it can be seen, the second portion of the second electrode manufactured in this manner covers only over the upper surface of the first portion of the second electrode but over a portion of the upper surface of the pixel defining layer.

With the abovementioned solutions, through two depositions of material for the electrode, the first portion and the second portion of the second electrode are formed in sequence. In a first deposition, the deposited first portion of the second electrode is required to fill and level up difference in height between the pixel defining layer and the light emitting layer, in other words, to substantially eliminate difference in height between the pixel defining layer and the first portion of the second electrode after the filling and leveling up. Then, a further deposition of the material for the electrode is performed to form the second portion of the second electrode, so that the second portion of the second electrode is connected with a second electrode of another pixel unit, to form common electrode. In this way, the resulted common electrode substantially covers over the substrate in a plane manner, accordingly, phenomenon including fractures, abscissions, bubbles and the like due to existence of difference in height in the pixel region will be eliminated, averting adverse influence resulting in failures of the display apparatus.

A further description of objects, technique solutions and advantages of the present invention has been provided in conjunction with abovementioned embodiments. It should be understood that the above description is merely used to illustrate specific embodiments of the present invention, but not to limit the present invention. All of changes, equivalent alternatives, improvements, made within principles and spirit of the invention, should be included within the scope of the present invention.

What is claimed is:

1. A method for manufacturing a first pixel unit, the method comprising:
    forming a first electrode;
    forming a pixel defining layer, and patterning the pixel defining layer to define a pixel region;
    forming a light emitting layer within the pixel region;
    forming a first portion of a second electrode on the light emitting layer such that an upper surface of the first portion of the second electrode is substantially in same plane with an upper surface of the pixel defining layer; and
    forming then a second portion of the second electrode on the first portion of the second electrode, wherein the second portion of the second electrode is configured to be connected with a second electrode of a second pixel unit adjacent to the first pixel unit.

2. The method of claim 1, wherein the upper surface of the first portion of the second electrode is substantially in same plane with the upper surface of the pixel defining layer such that a difference in height between the first portion of the second electrode and the pixel defining layer is from −200 nm to 200 nm.

3. The method of claim 1, wherein the first portion of the second electrode is formed by using a block-type fine metal mask.

4. The method of claim 1, wherein the second portion of the second electrode is formed by using a slit-type fine metal mask or an open-type mask.

5. The method of claim 2, wherein the second portion of the second electrode is formed by means of using a slit-type fine metal mask or an open-type mask.

6. The method of claim 3, wherein the second portion of the second electrode is formed by means of using a slit-type fine metal mask or an open-type mask.

7. A first pixel unit manufactured by the method of claim 1, the first pixel unit comprising:
    the first electrode;
    the pixel defining layer;
    the light emitting layer; and
    the second electrode;
    wherein:
        the second electrode comprises the first portion and the second portion;
        the pixel defining layer defines the pixel region;
        the light emitting layer and the first portion of the second electrode are disposed successively within the pixel region, and the upper surface of the first portion of the second electrode is substantially in same plane with the upper surface of the pixel defining layer; and
        the second portion of the second electrode is positioned over the first portion and is configured to be connected with a second electrode of a second pixel unit adjacent to the first pixel unit.

8. The first pixel unit of claim 7, wherein the upper surface of the first portion of the second electrode is substantially in same plane with the upper surface of the pixel defining layer such that a difference in height between the first portion of the second electrode and the pixel defining layer is from −200 nm to 200 nm.

9. The first pixel unit of claim 7, wherein the second portion of the second electrode is further formed on the pixel defining layer.

10. The first pixel unit of claim 9, wherein the second portion of the second electrode is further formed on a part of the pixel defining layer or the entire pixel defining layer.

11. The first pixel unit of claim 7, wherein the first electrode is a positive electrode and the second electrode is a negative electrode.

12. A display panel comprising the first pixel unit of claim 7.

13. A display apparatus comprising the display panel of claim 12.

14. A display panel comprising the first pixel unit of claim 8.

15. A display apparatus comprising the display panel of claim 14.

16. A display panel comprising the first pixel unit of claim 10.

17. A display apparatus comprising the display panel of claim 16.

18. A display panel comprising the first pixel unit of claim 11.

19. A display apparatus comprising the display panel of claim 18.

* * * * *